United States Patent
Li et al.

(10) Patent No.: US 6,670,278 B2
(45) Date of Patent: Dec. 30, 2003

(54) METHOD OF PLASMA ETCHING OF SILICON CARBIDE

(75) Inventors: Si Yi Li, Fremont, CA (US); Helen H. Zhu, Fremont, CA (US); S. M. Reza Sadjadi, Saratoga, CA (US); David R. Pirkle, Soquel, CA (US); James Bowers, Brookfield, CT (US); Michael Goss, Mendon, MA (US)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 09/820,726

(22) Filed: Mar. 30, 2001

(65) Prior Publication Data

US 2002/0177322 A1 Nov. 28, 2002

(51) Int. Cl.$^7$ .............................................. H01L 21/302
(52) U.S. Cl. ........................ 438/710; 438/714; 438/723
(58) Field of Search ................................ 438/700, 706, 438/710, 711, 714, 719, 723, 724

(56) References Cited

U.S. PATENT DOCUMENTS

| | | |
|---|---|---|
| 3,398,033 A | 8/1968 | Haga et al. |
| 4,351,894 A | 9/1982 | Yonezawa et al. |
| 4,529,476 A | 7/1985 | Kawamoto et al. |
| 4,595,453 A | 6/1986 | Yamazaki et al. |
| 4,735,920 A | 4/1988 | Stephani et al. |
| 4,865,685 A | 9/1989 | Palmour |
| 4,866,005 A | 9/1989 | Davis et al. |
| 4,946,547 A | 8/1990 | Palmour et al. |
| 4,981,551 A | 1/1991 | Palmour |
| 5,011,706 A | 4/1991 | Tarhay et al. |
| 5,318,668 A | 6/1994 | Tamaki et al. |
| 5,436,174 A | 7/1995 | Baliga et al. |
| 5,611,888 A | 3/1997 | Bosch et al. |
| 5,786,276 A | 7/1998 | Brooks et al. |
| 5,820,261 A | 10/1998 | Yam |
| 5,820,723 A | 10/1998 | Benjamin et al. |
| 5,958,793 A | 9/1999 | Patel et al. |
| 6,015,761 A * | 1/2000 | Merry et al. ................ 438/727 |
| 6,051,504 A | 4/2000 | Armacost et al. |
| 6,080,529 A | 6/2000 | Ye et al. |
| 6,090,304 A | 7/2000 | Zhu et al. |
| 6,103,590 A * | 8/2000 | Swanson et al. ........... 438/409 |
| 6,153,935 A | 11/2000 | Edelstein et al. |
| 6,171,945 B1 | 1/2001 | Mandal et al. |
| 6,261,892 B1 * | 7/2001 | Swanson ..................... 438/238 |
| 6,284,657 B1 * | 9/2001 | Chooi et al. ................ 438/687 |

OTHER PUBLICATIONS

"Silicon Carbide ICs", by Tim Whitaker, from Compound Semiconductor Magazine Issue 6 No. 1 (Jan. 2000).
"Silicon Carbide and Gallium Nitride Circuits for Wireless Communication: Why, What and When", by Raymond Pengelly, From Compound Semiconductor Magazine Issue 6 No. 4 (May/Jun. 2000).

* cited by examiner

Primary Examiner—Kin-Chan Chen
(74) Attorney, Agent, or Firm—Burns, Doane, Swecker & Mathis, LLP

(57) ABSTRACT

The invention provides a process for plasma etching silicon carbide with selectivity to an overlapping and/or underlying dielectric layer of material. The etching gas includes a hydrogen-containing fluorocarbon gas such as $CH_3F$, an oxygen-containing gas such as $O_2$ and an optional carrier gas such as Ar. The dielectric material can comprise silicon dioxide, silicon nitride, silicon oxynitride or various low-k dielectric materials including organic low-k materials. In order to achieve a desired selectivity to such dielectric materials, the plasma etch gas chemistry is selected to achieve a desired etch rate of the silicon carbide while etching the dielectric material at a slower rate. The process can be used to selectively etch a hydrogenated silicon carbide etch stop layer or silicon carbide substrates.

22 Claims, 5 Drawing Sheets

*Pre-etch Condition*

*Post-etch Condition*

METHOD OF PLASMA ETCHING OF SILICON CARBIDE

FIELD OF THE INVENTION

Figures 1A, 1B:
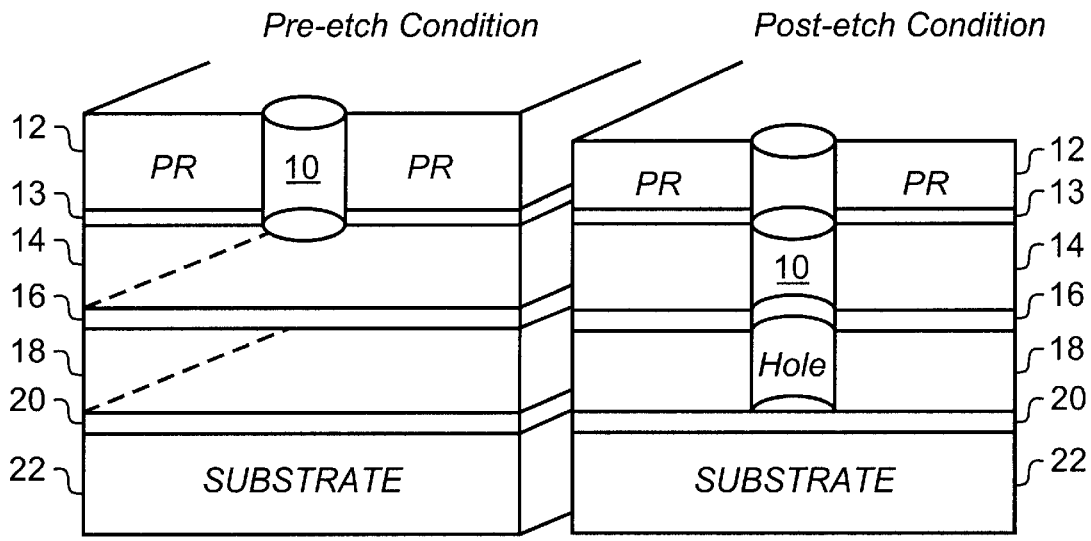

The present invention relates to an improved process of plasma etching dielectric materials such as silicon carbide.

BACKGROUND OF THE INVENTION

In the discussion of the state of the art that follows, reference is made to certain structures and/or methods. However, the following references should not be construed as an admission that these structures and/or methods constitute prior art. Applicant expressly reserves the right to demonstrate that such structures and/or methods do not qualify as prior art against the present invention.

Semiconductor materials may be manufactured into specific electronic devices, such as transistors, diodes, capacitors and the like, by the selective build up and removal of layers of materials. In the fabrication of integrated circuits, the continuing increase in the number of devices on a chip and the accompanying decrease in the minimum feature sizes have placed increasingly difficult demands upon many of the fabrication steps used in integrated circuit fabrication including depositing layers of different materials onto sometimes difficult topologies and the removal of material and formation of features within those layers.

Etching is one technique for removing layers of semiconductor or other materials from a given substrate and producing features on integrated circuits. During an etching process material is removed by interaction with another material, generally referred to as the etchant. Etching techniques fall into two broad categories: wet etching which generally refers to techniques which take place in solutions or molten salts or other liquid materials; and dry etching which generally refers to the use of gases or plasmas to perform the removal.

Dry etching techniques are of particular interest in producing electronic devices because they generally exhibit better resolution and improved dimensional and shape control capabilities than do the various methods of wet etching. Accordingly, dry etching is favorably utilized where superior pattern control and delineation are required, such as the processing of semiconductor wafers to form large scale integrated devices and integrated circuits.

One important factor associated with etching is etch selectivity. Etch selectivity refers to the ratio of etch rates of two different materials on a workpiece undergoing etching in the plasma reactor. In one scenario, it is desired that a first material on a workpiece be etched much faster than a second material. This is the scenario, for example, when employing masking techniques. Etch processes advantageously employing selectivity ratios may produce high aspect ratio features, defined as the ratio of the depth to the width of a feature, and contribute to high density features.

A second important factor associated with etching is anisotropy. Anisotropy refers to the directional dependence of the etch rate. Based on crystallographic preferences or etching conditions, an etch may occur in one direction of a material at a different rate than in a second direction. However, anisotropy should not be achieved by operating the plasma reactor in a pure sputtering mode in which the plasma ejects particles toward the wafer with sufficiently high energy that they sputter the material. Sputtering is generally non-selective, and high-energy sputtering may degrade semiconducting material exposed at the bottom of etched features. Etch processes advantageously employing anisotropy may produce vertical side walls in features and contribute to high density features.

A plasma reactor may be employed to perform various processes on a semiconductor wafer in microelectronic fabrication including dry etching. A wafer is placed inside a vacuum chamber of the reactor and process gases, including etchant gases, are introduced into the chamber. The gases are energized to ignite and maintain a plasma. Depending upon the composition of the gases from which the plasma is formed, the plasma may be employed to etch a particular material from the wafer or may be employed to deposit a thin film layer of material onto the wafer.

Selective etching processes have also been developed which depend more upon chemical effects. These processes are often described as reactive ion etching (RIE). A sufficiently high degree of selectivity allows new structures to be fabricated without the need for precise lithography for each level.

The manufacture of multilayer structures typically involves patterned etching of areas of the semiconductor surface that are covered by a photoresist protective material. Metallization patterns on integrated circuits can be formed by depositing a dielectric layer, patterning the dielectric layer to form a groove or trench, and depositing a metal layer that fills the trench in the dielectric layer. Any excess metal on the surface of the substrate is typically removed using either chemical-mechanical polishing (CMP) or an etch-back process. This process, called the "damascene process," can be used to form conductors in-laid in a dielectric layer.

One method to pattern a dielectric layer is photolithography combined with reactive ion etching (RIE). In this process, a semiconductor wafer is patterned with a photoresist mask and is positioned in a reaction chamber. Etchant gases are fed into the chamber and dissociated in a radio frequency (RF) field so that ions contained in the etchant gases are accelerated to the wafer surface. The accelerated ions combine chemically with unmasked material on the wafer surface. As a result, volatile etch product is produced and is incorporated into the plasma. The concentration of the volatile etch product can be monitored in order to determine the end-point of the RIE process, i.e., when the chemical reaction has removed the desired level of material from the wafer surface. During the RIE process, a single layer or multiple layers of material or film may be removed. These materials may include, for example, silicon nitride ($Si_3N_4$), PSG, silicon dioxide ($SiO_2$) and poly-silicon (PSi).

Multi-level structures containing vias and trenches can be formed by successive application of either a single-damascene or a dual-damascene process, or a combination of both types of processes. For example, in any level having a trench, a via could also be formed (either before or after formation of the trench) resulting in a dual-damascene recess. This recess is then typically lined with a liner (which functions as a diffusion barrier for the conductive material) and then filled with a conductive material.

In a typical dual damascene process, an etch stop can be used to facilitate formation of vias and trenches in an upper layer of the damascene structure. See, for example, U.S. Pat. No. 6,153,935. The etch-stop is typically a thin (about 20 to about 50 nm thick) layer of a silicon-based compound such as silicon nitride or silicon carbide. The etch-stop can be blanket-deposited by any process known in the art for depositing thin dielectric layers, such as CVD, evaporation, sputtering, etc. When a via is formed above the etch-stop in the formation of multi-level structures, the etch-stop is used to stop the first etch through the dielectric material above the etch-stop. A second, shorter etch using a different reactive gas mixture is then used to open the etch-stop layer to expose underlying layers.

Due to the small line widths of modern integrated circuits, it is becoming increasingly desirable to maintain vertical or near vertical sidewall profiles during etching. Thus, when etching through the etch stop layer, the etching of other layers of the multi-layer substrate such as dielectric materials which are exposed to the etching plasma should be minimized. Further, to maintain the flatness of the bottom of the opening, any over-etching of the dielectric material underlying the etch stop layer should also be minimized.

The development of new low-k dielectric materials (k<4) for use in damascene structures has created new challenges for etching vias and trenches. Many of these low-k materials, particularly the polymeric low-k materials, can be eroded during the etching of the other layers of the structure including the etch-stop layer. As a result, control over sidewall and bottom profiles of the etched openings is reduced.

$CH_3F$ is known as an etchant gas. See, for example, U.S. Pat. No. 6,153,935, issued to Edelstein et al.; U.S. Pat. No. 6,080,529, issued to Ye et al.; U.S. Pat. No. 6,051,504, issued to Armacost et al.; U.S. Pat. No. 5,786,276, issued to Brooks et al.; and U.S. Pat. No. 4,529,476, issued to Kawamoto et al. Commonly owned U.S. Pat. No. 6,090,304, issued to Zhu, discloses a plasma etch process for selectively etching a photoresist masked dielectric layer using $C_xF_y$ and $N_2$. U.S. Pat. Nos. 4,865,685 and 4,981,551, both issued to Palmour, disclose reactive ion etching of SiC using $NF_3$ and, alternatively, $NF_3$ mixed with $O_2$ and argon (Ar).

U.S. Pat. No. 3,398,033, issued to Haga, discusses wet etching of silicon carbide by the use of a chemical reaction of a mixture of oxygen ($O_2$) and chlorine ($Cl_2$) heated to between 1200° C. and 1300° C. U.S. Pat. No. 4,351,894, issued to Yonezawa, discloses a plasma etch process for removing SiC using carbon tetrafluoride ($CF_4$) and optionally oxygen ($O_2$). U.S. Pat. No. 4,595,453, issued to Yamazaki, discloses using hydrogen fluoride gas (HF) in a dry etch plasma process. U.S. Pat. Nos. 4,865,685 and 4,981,551, both issued to Palmour, disclose reactive ion etching of SiC using $NF_3$ and, alternatively, $NF_3$ mixed with $O_2$ and argon (Ar).

There is thus a need for etching gas compositions and processes which selectively etch etch-stop and diffusion barrier materials such as silicon carbide in a dual damascene structure.

SUMMARY OF THE INVENTION

The invention provides a method of plasma etching a layer of silicon carbide with selectivity to an underlying and/or an overlying dielectric material. A substrate, including a layer of silicon carbide and an underlying and/or an overlying layer of dielectric material, is positioned in a reactor chamber and an etchant gas of a hydrogen-containing fluorocarbon gas, an oxygen containing gas, and optional carrier gas are supplied to the chamber and energized into a plasma state. The plasma etches openings in the silicon carbide layer and the silicon carbide layer is etched at a faster rate than the dielectric material. The silicon carbide may be hydrogenated silicon carbide (HSC).

The substrate may be a silicon wafer and may include a patterned silicon dioxide hard mask and layer of low-k dielectric above and/or below the silicon carbide layer. The low-k dielectric above the silicon carbide layer may be previously etched to expose the silicon carbide layer at locations corresponding to openings in the hard mask. The low-k dielectric material may be an organic polymer material.

The method according to the invention can provide a silicon carbide etch rate of at least 1200 Å/min and a silicon carbide:dielectric etch rate selectivity ratio of at least 15. Both medium density and high density reactor chambers may be used including an ECR plasma reactor, an inductively coupled plasma reactor, a capacitively coupled reactor, a helicon plasma reactor or a magnetron plasma reactor. A preferred reactor is a dual frequency capacitively coupled reactor which provides a medium density plasma. The method may be used to etch openings in a substrate, such as vias, contacts, and/or trenches and may be used as an etch method to form a single or dual damascene structure.

The hydrogen-containing fluorocarbon gas can be at least one of $CH_3F$, $CH_2F_2$, $CHF_3$ and $C_2H_4F_6$, oxygen containing gas may be $O_2$, CO, or $CO_2$ and the carrier gas may be He, Ne, Ar, Kr, or Xe. A preferred hydrogen-containing fluorocarbon gas is $CH_3F$ and a preferred oxygen containing gas is $O_2$ supplied to the chamber in a $CH_3F:O_2$ flow rate ratio of 0.5 to 2.

BRIEF DESCRIPTION OF THE DRAWING FIGURES

Figures 1C, 1D:
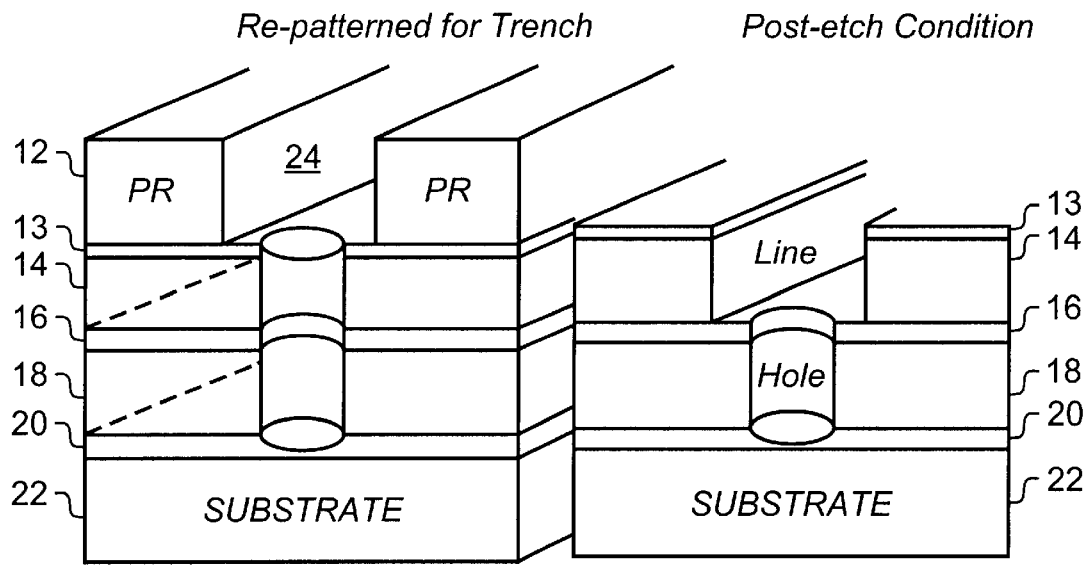
Figures 2A, 2B:
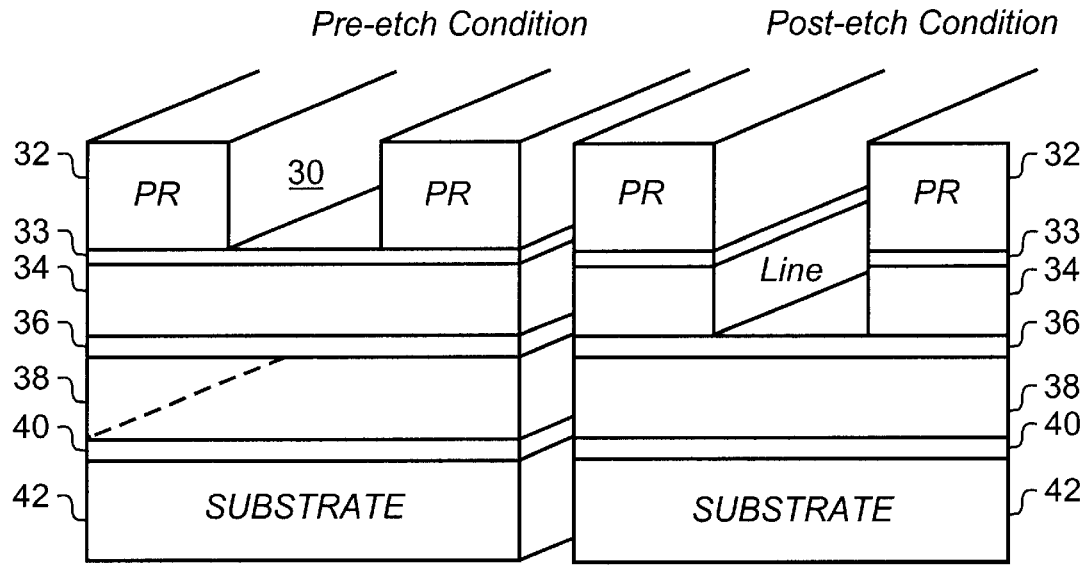
Figures 2C, 2D:
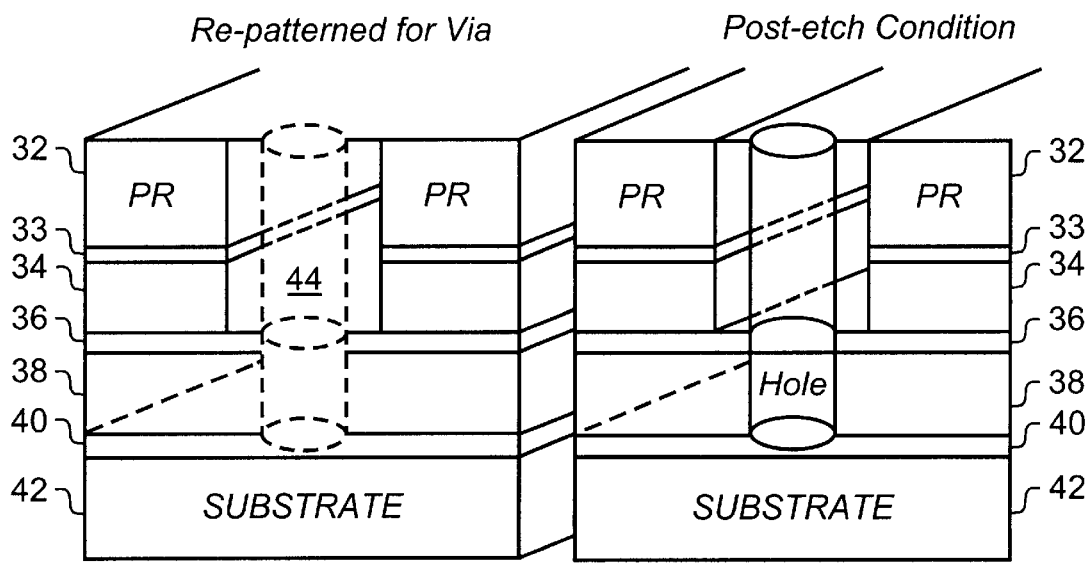
Figure 3A:
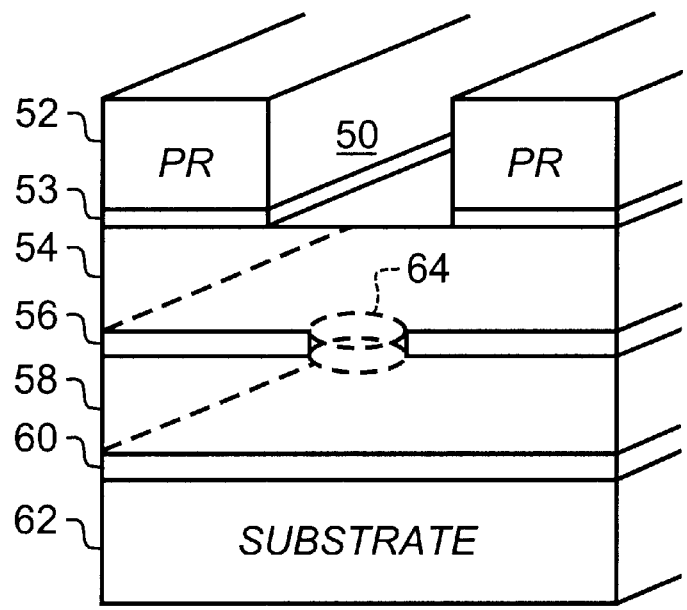
Figure 3B:
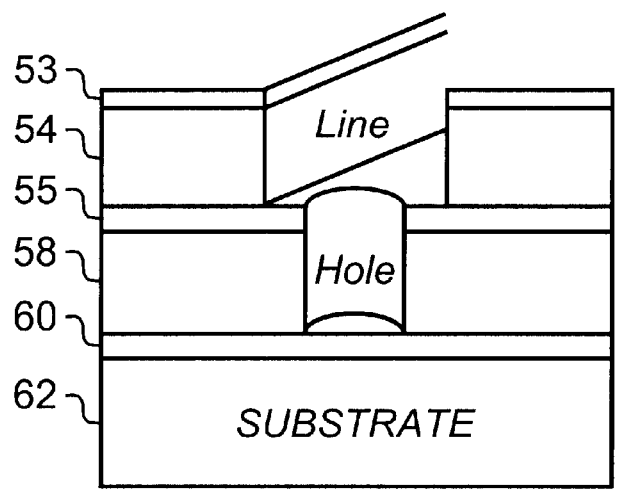
Figure 4:
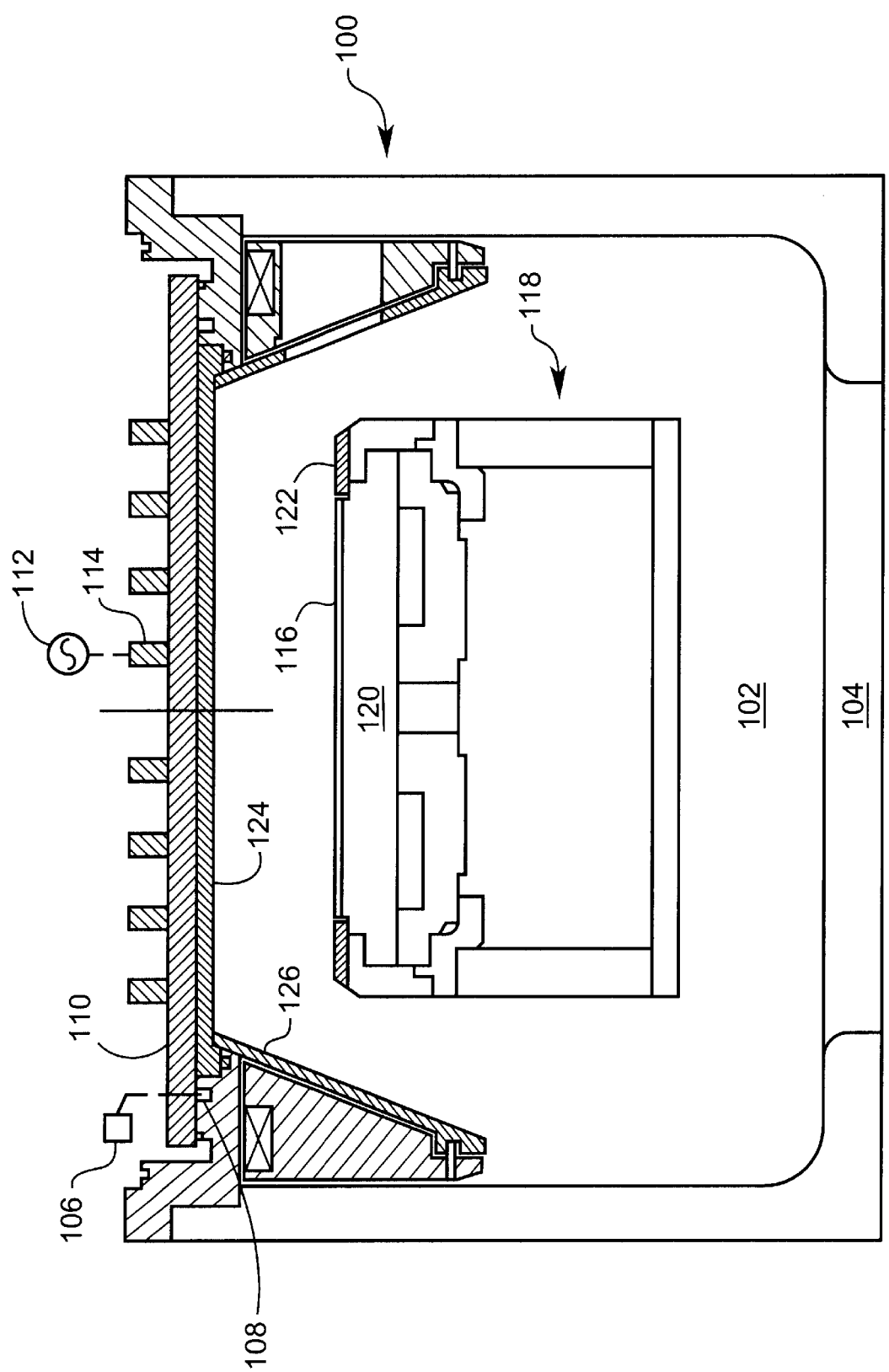
Figure 5:
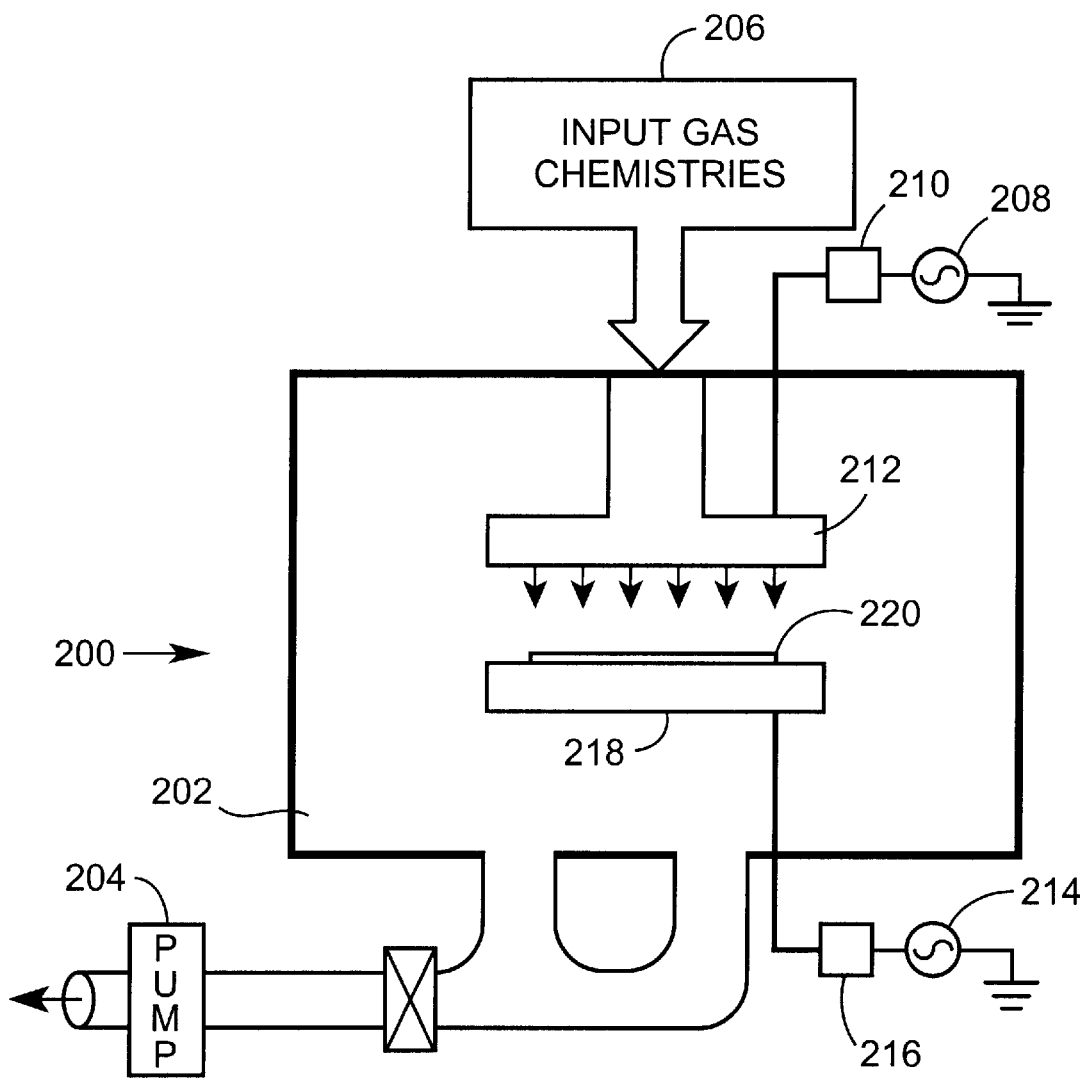

The objects and advantages of the invention will become apparent from the following detailed description of preferred embodiments thereof in connection with the accompanying drawings in which like numerals designate like elements and in which:

FIGS. 1A–D show schematic representations of a via-first dual-damascene structure which can be etched according to the process of the invention, FIG. 1A showing a pre-etch condition, FIG. 1B showing a post-etch condition in which a via has been etched, FIG. 1C showing the structure re-patterned for a trench etch and FIG. 1D showing a post-etch condition in which the trench has been etched;

FIGS. 2A–D show schematic representations of a trench-first dual-damascene structure which can be etched according to the process of the invention, FIG. 2A showing a pre-etch condition, FIG. 2B showing a post-etch condition in which a trench has been etched, FIG. 2C showing the structure re-patterned for a via etch and FIG. 2D showing a post-etch condition in which the via has been etched;

FIGS. 3A–B show schematic representations of a self-aligned dual-damascene structure which can be etched according to the process of the invention, FIG. 3B showing a pre-etch condition and FIG. 3B showing a post-etch condition in which a trench and a via have been etched;

FIG. 4 shows a schematic representation of an inductively coupled high density plasma reactor which can be used to carry out the process of the invention; and FIG. 5 shows a schematic representation of a medium density parallel plate plasma reactor which can be used to carry out the process of the invention.

DETAILED DESCRIPTION OF PREFERRED EMBODIMENTS

The invention provides a process for plasma etching silicon carbide (SiC) with selectivity to an overlapping and/or underlying dielectric layer of material. The dielectric material can comprise various low-k dielectric materials, including organic low-k materials, inorganic dielectric materials, silicon dioxide, silicon oxynitride, silicon nitride, or the like. In order to achieve a desired selectivity to such dielectric materials, the plasma etch gas chemistry is selected to achieve a desired etch rate of the silicon carbide while etching the dielectric material at a slower rate.

Silicon carbide has favorable characteristics as a semiconductor material, including its wide bandgap, high thermal conductivity, high saturated electron drift velocity, and high electron mobility. These characteristics make SiC an attractive dielectric material for integrated circuits. Additionally, SiC has found application as etch stops, protective coatings, masks, diffusion barriers, and the like due to its relative resistance to certain types of etchants utilized in multilayer integrated circuit manufacturing. However, there are certain difficulties working with silicon carbide, including high process temperatures, impurity of starting materials, difficulty with certain doping techniques, and limited development of suitable etching techniques with high selectivity ratios.

The invention provides a dry etching process for the formation of features such as contacts, vias, trenches, conductor lines, etc. in dielectric materials in the manufacture of integrated circuits. An example of an etchant gas chemistry is a gaseous composition of a fluorine containing gas, an oxygen containing gas, and optionally a carrier gas. Preferably, the etchant gas is a combination of $CH_3F$, $O_2$, and an inert gas as a carrier gas, such as argon (Ar), where a preferred $CH_3F:O_2$ flow rate ratio is 0.5 to 2.0, more preferably 1.25 to 1.75. The gaseous composition may be utilized in a reactor chamber to initiate and sustain a plasma reaction that etches a substrate having a layer of silicon carbide thereon.

The invention provides a semiconductor manufacturing process wherein openings can be plasma etched in silicon carbide layers while providing desired selectivity to underlying and/or overlying dielectric layers such as silicon dioxide ($SiO_2$), silicon nitride ($Si_3N_4$), silicon oxynitride and photoresist materials (PR). Such selectivity is of great interest in the manufacture of damascene structures wherein one or more silicon carbide etch stop layers are incorporated in a multilayer structure. During manufacture of such structures, features such as contacts, vias, conductor lines, etc. are etched in dielectric materials such as oxide and organosilicate glass layers in the manufacture of integrated circuits. The invention overcomes a problem with prior etching techniques wherein the selectivity between the silicon carbide and the overlying and/or underlying layers such as mask/oxide/low-k dielectric/photoresist layers was too low for commercial applications. Such selectivity problems are solved by utilizing an etching gas chemistry which reduces the etch rates of such layers relative to the silicon carbide material.

According to one aspect of the invention, in the manufacture of a single or dual-damascene structure wherein a low-k dielectric layer is etched with 0.25 µm or smaller geometry to an etch depth of at least 1.8 µm, a silicon carbide etch stop layer is etched with a silicon carbide:low-k dielectric/photoresist/oxide etch rate selectivity of greater than 5:1. Such structures can include a hard mask having a thickness of around 40 to 60 nm, low-k dielectric layers having thicknesses of around 200 to 400 nm, etch stop layers having a thickness of around 40 to 60 nm, barrier layers having a thickness of around 40 to 60 nm, metallization layers, metallization filled vias and trenches, and the like. In the following description, silicon carbide may be used for one or more layers of various damascene structures. However, the process of the invention is applicable to any integrated circuit structure wherein silicon carbide is used as an etched component of the structure.

FIGS. 1A–D show schematics of how a silicon carbide layer can be etched during a via first dual-damascene etch process. FIG. 1A shows a pre-etch condition wherein an opening 10 corresponding to a via is provided in a photoresist 12 which overlies a stack of layers including a mask 13 of silicon dioxide, silicon nitride, silicon carbide, silicon nitride, or the like, a first low-k dielectric layer 14, a first stop layer 16 such as silicon nitride or silicon carbide, a second low-k dielectric layer 18, a second stop layer 20 such as silicon nitride or silicon carbide, and a substrate 22 such as a silicon wafer which may include an electrically conductive layer (not shown) and other layers such as barrier layers (not shown) beneath the etch stop layer 20. FIG. 1B shows the structure after etching wherein the opening 10 extends through the mask 13, the low-k dielectric layers 14, 18 and first stop layer 16 to the second stop layer 20. FIG. 1C shows the structure after re-patterning the masking layer for a trench 24. FIG. 1D shows the structure after stripping of the photoresist and etching wherein the first low-k dielectric layer 14 is etched down to the first stop layer 16.

FIGS. 2A–D show schematics of how a silicon carbide layer can be etched during a trench-first dual-damascene etch process. FIG. 2A shows a pre-etch condition wherein an opening 30 corresponding to a trench is provided in a photoresist masking layer 32 which overlies a stack of layers including a mask layer 33, a first low-k dielectric layer 34, a first stop layer 36 such as silicon nitride or silicon carbide, a second low-k dielectric layer 38, a second stop layer 40 such as silicon nitride or silicon carbide, and a substrate 42 such as a silicon wafer which may further include metallization and barrier layers (not shown) beneath the stop layer 40. FIG. 2B shows the structure after etching wherein the opening 30 extends through the low-k dielectric layer 34 to the first stop layer 36. FIG. 2C shows the structure after re-patterning for a via 44. FIG. 2D shows the structure after etching wherein the second low-k dielectric layer 38 is etched down to the second stop layer 40.

FIGS. 3A–B show schematics of how a silicon carbide layer can be etched during a single step dual-damascene etch process. FIG. 3A shows a pre-etch condition wherein an opening 50 corresponding to a trench is provided in a photoresist 52 and a masking layer 53 which overlies a stack of layers including a first low-k dielectric layer 54, a first stop layer 56 such as silicon nitride or silicon carbide, a second low-k dielectric layer 58, a second stop layer 60 such as silicon nitride or silicon carbide, and a substrate 62 such as a silicon wafer which can include metallization and barrier layers (not shown) beneath the stop layer 60. In order to obtain etching of vias through the first stop layer 56 in a single etching step, first stop layer 56 includes an opening 64. FIG. 2B shows the structure after etching wherein the opening 50 extends through the low-k dielectric layer 54 to the first stop layer 56 and the opening 64 extends through the second low-k dielectric 58 to the second stop layer 60. Such an arrangement can be referred to as a "self-aligned dual-damascene" structure.

The process of the invention is applicable to etching of silicon carbide layers in damascene or other integrated circuit structures including etching of silicon carbide layers in the form of substrates. The process of the invention is particularly useful in manufacturing multilayer structures which include various low-k dielectric layers including doped silicon oxide such as fluorinated silicon oxide (FSG), silicate glasses such as boron phosphate silicate glass (BPSG) and phosphate silicate glass (PSG), organic polymer materials such as polyimide, organic siloxane polymer, poly-arylene ether, carbon-doped silicate glass, silsesquioxane glass, fluorinated and non-fluorinated silicate glass, diamond-like amorphous carbon, aromatic hydrocarbon polymer such as SiLK (a product available from Dow Chemical Co.), c-doped silica glass such as CORAL (a product available from Novellus Systems, Inc.), or other suitable dielectric material having a dielectric constant below 4.0, preferably below 3.0. Such low-k dielectric layers can overlie an intermediate layer such as a barrier layer and a conductive or semiconductive layer such as polycrystalline silicon, metals such as aluminum, copper, titanium, tungsten, molybdenum or alloys thereof, nitrides such as titanium nitride, metal silicides such as titanium silicide, cobalt silicide, tungsten silicide, molybdenum silicide, etc.

The plasma can be produced in various types of plasma reactors. Such plasma reactors typically have energy sources which use RF energy, microwave energy, magnetic fields, etc. to produce a medium to high density plasma. For instance, a high density plasma could be produced in a transformer coupled plasma (TCP™) etch reactor available from Lam Research Corporation which is also called inductively coupled plasma reactor, an electron-cyclotron resonance (ECR) plasma reactor, a helicon plasma reactor, or the like. An example of a high flow plasma reactor which can provide a high density plasma is disclosed in commonly owned U.S. Pat. No. 5,820,723, the disclosure of which is hereby incorporated by reference. The plasma can also be produced in a parallel plate etch reactor such as the dual frequency plasma etch reactor described in commonly owned U.S. Pat. No. 6,090,304, the disclosure of which is hereby incorporated by reference.

The process of the invention can be carried out in an inductively coupled plasma reactor such as reactor 100 shown in FIG. 4. The reactor 100 includes an interior 102 maintained at a desired vacuum pressure by a vacuum pump connected to an outlet 104 in a lower wall of the reactor. Etching gas can be supplied to a showerhead arrangement be supplying gas from gas supply 106 to a plenum 108 extending around the underside of a dielectric window 110. A high density plasma can be generated in the reactor by supplying RF energy from an RF source 112 to an external RF antenna 114 such as a planar spiral coil having one or more turns outside the dielectric window 110 on top of the reactor. The plasma generating source can be part of a modular mounting arrangement removably mounted in a vacuum tight manner on the upper end of the reactor.

A semiconductor substrate 116 such as a wafer is supported within the reactor on a substrate support 118 such as a cantilever chuck arrangement removably supported by a modular mounting arrangement from a sidewall of the reactor. The substrate support 118 is at one end of a support arm mounted in a cantilever fashion such that the entire substrate support/support arm assembly can be removed from the reactor by passing the assembly through an opening in the sidewall of the reactor. The substrate support 118 can include a chucking apparatus such as an electrostatic chuck 120 and the substrate can be surrounded by a dielectric focus ring 122. The chuck can include an RF biasing electrode for applying an RF bias to the substrate during an etching process. The etching gas supplied by gas supply 106 can flow through channels between the window 110 and an underlying gas distribution plate 124 and enter the interior 102 through gas outlets in the plate 124. The reactor can also include a heated liner 126 extending conically from the plate 124.

The process of the invention can also be carried out in a parallel plate plasma reactor such as reactor 200 shown in FIG. 5. The reactor 200 includes a chamber having an interior 202 maintained at a desired vacuum pressure by a vacuum pump 204 connected to an outlet in a wall of the reactor. Etching gas can be supplied to a showerhead electrode by supplying gas from gas supply 206. A medium density plasma can be generated in the reactor by a dual frequency arrangement wherein RF energy from RF source 208 is supplied through a match network 210 to a showerhead electrode 212 and RF energy from RF source 214 is supplied through a match network 216 to a bottom electrode 218. Alternatively, the showerhead electrode 212 can be electrically grounded and RF energy at two different frequencies can be supplied to the bottom electrode 218. A substrate 220 supported on the bottom electrode 218 can be etched with plasma generated by energizing the etch gasses into a plasma state.

An example of an etch process carried out in a dual frequency medium density parallel plate plasma chamber is set forth in Table 1 wherein the etchant gas chemistry is a $CH_3F/O_2/Ar$ mixture. Although the optimal flow rates and ratios of this gas mixture may change depending on the choice of plasma etch chamber, substrate size, etc., in the case of etching a damascene structure on a 200 mm silicon wafer, the individual constituents of the etchant gas can be supplied to the reactor chamber at flow rates of: 5 to 70 sccm, and more preferably 25 to 35 sccm $CH_3F$; 5 to 30 sccm and more preferably 10 to 30 sccm $O_2$; and 0 to 500 sccm, and more preferably 200 to 300 sccm Ar. During etching, the chamber pressure can be set at 1 to 500 mTorr, preferably 5 to 200 mTorr. The ratio of the flow rate of $CH_3F$ to the flow rate of $O_2$ can be set at 0.5 to 2.0, preferably 1.25 to 1.75 to achieve a desired degree of selectivity with respect to other layers of the etched structure.

TABLE 1

| Etchant Gas Component | Flow Rate (sccm) | Chamber Pressure (mTorr) | Top RF Power (W) | Bottom RF Power (W) | SiC Etch Rate (Å/min) |
| --- | --- | --- | --- | --- | --- |
| $CH_3F$ | 25 | 150 | 500 @ 2 MHZ | 150 @ 27 MHZ | 1330 |
| $O_2$ | 20 | | | | |
| Ar | 200 | | | | |

The above etching process can be modified by substituting and/or adding different gases for the $CH_3F$, $O_2$ and/or Ar. For example, in order to increase the etching rate of the silicon carbide layer, it may be desirable to add other F-containing gases such as $NF_3$ to the $CH_3F$. Likewise, if additional oxygen is desired, other gases such as carbon monoxide (CO) or carbon dioxide ($CO_2$) can be added to the $O_2$. Other inert gases can be substituted for or added to the Ar.

In the process utilizing the parameters of Table 1, the silicon carbide layer was located between dielectric layers of $SiO_2$ and $Si_3N_4$. Using a top electrode RF power of 500 watts and a bottom electrode power of 150 watts, the etch rate of the silicon carbide layer was about 1330 angstroms per minute (Å/min) while providing a selectivity ratio of $SiC:SiO_2$ of at least 15, preferably at least 18. Table 2 illustrates the selectivity achieved, by the process using the parameters of Table 1, between several dielectric materials and a number of exemplary materials that typically underlie or overlie the SiC layer.

TABLE 2

| Materials | SiC:SiO$_2$ | SiC:CORAL | CORAL:SiO$_2$ | SiN:CORAL | SiC:SiN | SiN:SiO$_2$ |
|---|---|---|---|---|---|---|
| Mean Selectivity | 18 | 5.0 | 3.6 | 3.6 | 1.4 | 12.7 |

The high SiC:dielectric selectivity can be obtained using other dielectric materials such as low-k organic dielectrics such as polyimide, an organic siloxane polymer, poly-arylene ether, carbon-doped silicate glass or silsesquioxane glass, spin-on glass, fluorinated or non-fluorinated silicate glass, diamond-like amorphous carbon, aromatic hydrocarbon polymer, such as "SiLK," a trademark of Dow Chemical Co., c-doped silica glass, such as "CORAL," a trademark of Novellus, or any similar low dielectric constant (low-k) material known in the art to be useful as a dielectric material.

Further, as is known to those familiar with plasma science, a plasma can be formed under a number of gas pressure and electric power conditions. It should be understood, therefore, that the selection of temperatures, power levels, and reactor pressures and etchant gas flow rates used in practicing the present invention can vary widely and that those specified herein are given by way of example, and not as limitations on the scope of the invention.

Although the present invention has been described in connection with preferred embodiments thereof, it will be appreciated by those skilled in the art that additions, deletions, modifications, and substitutions not specifically described may be made without department from the spirit and scope of the invention as defined in the appended claims.

What is claimed is:

1. A method of plasma etching a layer of silicon carbide with selectivity to underlying and overlying low-k layers of dielectric material, the method comprising:

positioning a semiconductor substrate in a reactor chamber, the substrate including a layer of silicon carbide and underlying and overlying layers of low-k dielectric material;

supplying an etchant gas to the chamber, the etchant gas comprising at least one hydrogen-containing fluorocarbon gas, an oxygen containing gas, and optional carrier gas; and energizing the etchant gas into a plasma state and forming etched openings in the silicon carbide layer, the etched openings being defined by openings in the overlying layer of low-k dielectric material and the etched openings being over the underlying layer of low-k dielectric material, the silicon carbide layer being etched at a faster rate than the underlying and overlying layers of low-k dielectric material.

2. The method of claim 1, wherein the hydrogen-containing fluorocarbon gas is at least one of CH$_3$F, CH$_2$F$_2$, CHF$_3$ and C$_2$H$_4$F$_6$.

3. The method of claim 1, wherein the hydrogen-containing fluorocarbon gas is C$_x$H$_y$F$_z$ where x is $\geq 1$, y is $\geq 2$ and z is $\geq 1$ and the oxygen-containing gas is O$_2$.

4. The method of claim 3, wherein C$_x$H$_y$F$_z$ is CH$_3$F and the gas composition is supplied to the chamber at a flow rate ratio of CH$_3$F:O$_2$ of about 1:2 to about 2:1.

5. The method of claim 3, wherein the CH$_3$F is supplied to the chamber at a flow rate of about 15 to 35 sccm and the O$_2$ is supplied to the chamber at a flow rate of about 10 to 30 sccm.

6. The method of claim 1, wherein the carrier gas is argon and the argon is supplied to the reactor chamber at a rate of 50 to 400 sccm.

7. The method of claim 1, wherein the etchant gas further comprises NF$_3$, the NF$_3$ being supplied to the chamber at a flow rate which is less than a flow rate of the C$_x$H$_y$F$_z$.

8. The method of claim 1, wherein the oxygen containing gas is O$_2$, CO, or CO$_2$.

9. The method of claim 1, wherein the carrier gas is He, Ne, Ar, Kr, or Xe, the etchant gas consisting essentially of the hydrogen-containing fluorocarbon gas, the oxygen-containing gas and the carrier gas.

10. The method of claim 1, wherein the silicon carbide is etched with an etch rate selectivity to an overlying silicon oxide mask layer of at least 10.

11. The method of claim 1, wherein the silicon carbide is etched with an etch rate selectivity to the overlying and underlying low-k dielectric layers of at least 5.

12. The method of claim 1, wherein the silicon carbide etch rate is at least 1200 Å/mm.

13. A method of plasma etching a layer of silicon carbide with selectivity to an overlying layer of low-k dielectric material, the method comprising:

positioning a semiconductor substrate in a reactor chamber, the substrate including a layer of silicon carbide and an overlying layer of low-k dielectric material;

supplying an etchant gas to the chamber, the etchant gas comprising at least one hydrogen-containing fluorocarbon gas, an oxygen containing gas, and optional carrier gas; and energizing the etchant gas into a plasma state and forming etched openings in the silicon carbide layer, the etched openings being defined by openings in the overlying layer of low-k dielectric material, the silicon carbide layer being etched at a faster rate than the overlying layer of low-k dielectric material, wherein the substrate includes a patterned silicon dioxide hard mask above the layer of low-k dielectric material, the layer of low-k dielectric material having been previously etched to expose the silicon carbide layer at locations corresponding to openings in the hard mask, the silicon carbide being etched with an etch rate selectivity to the hard mask of at least 5.

14. The method of claim 13, wherein the low-k dielectric material is a low-k dielectric organic polymer material.

15. The method of claim 1, wherein the reactor chamber comprises an ECR plasma reactor, an inductively coupled plasma reactor, a capacitively coupled reactor, a helicon plasma reactor or a magnetron plasma reactor.

16. The method of claim 1, wherein the openings comprise vias, contacts, and/or trenches.

17. The method of claim 1, wherein the openings are in a single or dual damascene structure.

18. The method of claim 1, wherein the chamber pressure in the reactor chamber is 50 to 250 mTorr.

19. The method of claim 1, wherein the silicon carbide is hydrogenated silicon carbide.

20. The method of claim 1, wherein the silicon carbide layer comprises an upper portion of a silicon carbide substrate.

21. The method of claim 1, wherein the substrate includes a patterned silicon dioxide hard mask above the layer of low-k dielectric material, the layer of low-k dielectric material having been previously etched to expose the silicon carbide layer at locations corresponding to openings in the hard mask.

22. A method of plasma etching a layer of silicon carbide with selectivity to underlying and overlying low-k layers of dielectric material, the method comprising:

positioning a semiconductor substrate in a reactor chamber, the substrate including a layer of silicon carbide, and underlying and overlying layers of low-k dielectric material, the low-k dielectric material having a dielectric constant of less than 3.0;

supplying an etchant gas to the chamber, the etchant gas comprising at least one hydrogen-containing fluorocarbon gas, an oxygen containing gas, and optional carrier gas; and energizing the etchant gas into a plasma state and forming etched openings in the silicon carbide layer, the etched openings being defined by openings in the overlying layer of low-k dielectric material and the etched openings being over the underlying layer of low-k dielectric material, the silicon carbide layer being etched at a faster rate than the underlying and overlying layers of low-k dielectric material.

* * * * *